(12) United States Patent
Alissa et al.

(10) Patent No.: US 12,389,568 B2
(45) Date of Patent: *Aug. 12, 2025

(54) IMMERSION COOLING SYSTEM THAT ENABLES INCREASED HEAT FLUX AT HEAT-GENERATING COMPONENTS OF COMPUTING DEVICES

(71) Applicant: Microsoft Technology Licensing, LLC, Redmond, WA (US)

(72) Inventors: Husam Atallah Alissa, Redmond, WA (US); Bharath Ramakrishnan, Bellevue, WA (US); Ioannis Manousakis, Redmond, WA (US); Nicholas Andrew Keehn, Kirkland, WA (US); Eric Clarence Peterson, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/639,745

(22) Filed: Apr. 18, 2024

(65) Prior Publication Data
US 2024/0268069 A1 Aug. 8, 2024

Related U.S. Application Data

(60) Continuation of application No. 18/212,961, filed on Jun. 22, 2023, now Pat. No. 11,997,827, which is a division of application No. 17/320,063, filed on May 13, 2021, now Pat. No. 11,729,948.

(51) Int. Cl.
*H05K 7/20* (2006.01)

(52) U.S. Cl.
CPC ......... *H05K 7/203* (2013.01); *H05K 7/20381* (2013.01); *H05K 7/20818* (2013.01); *H05K 7/20836* (2013.01)

(58) Field of Classification Search
CPC ............... H05K 7/203; H05K 7/20381; H05K 7/20818; H05K 7/20836
See application file for complete search history.

(56) References Cited

U.S. PATENT DOCUMENTS

| 8,184,436 B2* | 5/2012 | Campbell | H05K 7/203 361/701 |
| 2021/0120705 A1* | 4/2021 | Enright | H05K 7/203 |

* cited by examiner

*Primary Examiner* — Lionel Nouketcha
(74) *Attorney, Agent, or Firm* — Ray Quinney & Nebeker P.C.; Paul N. Taylor

(57) ABSTRACT

An immersion cooling system includes an immersion tank that is configured to retain dielectric working fluid and to hold a plurality of computing devices submerged in the dielectric working fluid. The immersion cooling system also includes a condenser that is configured to cause condensation of vaporized working fluid. The immersion cooling system also includes a subcooling heat exchanger that is in fluid communication with a coolant source. The coolant source provides coolant having a coolant temperature that is lower than a boiling point of the dielectric working fluid. The subcooling heat exchanger is positioned so that heat transfer can occur between the dielectric working fluid and the subcooling heat exchanger. The immersion cooling system also includes a control system that controls how much of the coolant flows into the subcooling heat exchanger based at least in part on a temperature of the dielectric working fluid.

20 Claims, 6 Drawing Sheets

IMMERSION COOLING SYSTEM THAT ENABLES INCREASED HEAT FLUX AT HEAT-GENERATING COMPONENTS OF COMPUTING DEVICES

CROSS-REFERENCE TO RELATED APPLICATIONS

This application is a continuation of U.S. patent application Ser. No. 18/212,961, filed Jun. 22, 2023, which claims priority to and the benefit of U.S. patent application Ser. No. 17/320,063, filed on May 13, 2021, which are hereby incorporated by reference in their entireties.

BACKGROUND

Computing devices include heat-generating components that produce significant amounts of heat during normal operation. Examples of such heat-generating components include central processing units (CPUs), graphics processing units (GPUs), tensor processing units (TPUs), memory devices, and other integrated circuits.

Computer cooling is the process of removing heat generated by heat-generating components within a computing device to keep components within permissible operating temperature limits. Cooling can be important because computer components are susceptible to temporary malfunction or permanent failure if they are overheated.

A datacenter is a physical facility that is used to house computing devices and associated components. A datacenter typically includes a large number of computing devices (e.g., servers), which may be stacked in racks that are placed in rows. A colocation center is a type of datacenter where equipment, space, and network bandwidth are available for rental to customers.

A datacenter typically includes a cooling system to enable the computing devices within the datacenter to continue working within their specified thermal limits. Many computing devices use air for cooling system components. This requires datacenters to utilize air-based cooling techniques to transfer the heat to the external environment. Air has a low specific heat capacity, which means that large amounts of air are required to remove a watt of heat. Air-based cooling techniques often require expensive infrastructure components such as computer room air conditioning (CRAC) units, air conditioner compressors, air circulation fans, duct work, air handlers, dehumidifiers, and the like.

One of the challenges in managing a datacenter is achieving the right balance between space and power. For various reasons, power density has increased considerably over the last few years. As server racks become more thermally dense requiring greater quantities of air for cooling, the costs and logistics of conventional cooling using air becomes increasingly challenging.

Some datacenters utilize immersion cooling techniques in which computing devices are submerged in a thermally conductive, electrically isolating dielectric fluid, which may be referred to as a dielectric working fluid or a heat transfer fluid. In an immersion cooling system, at least one container (e.g., a tank) is filled with the dielectric working fluid, and computing devices are placed in the container. The container may be referred to herein as an immersion tank. The dielectric working fluid has a higher heat capacity than air. Thus, the dielectric working fluid requires less fluid volume for a given heat load than air does.

Heat can be removed from the heat-generating components (e.g., integrated circuits) within the computing devices by circulating the dielectric working fluid into direct contact with the heat-generating components, then through heat exchangers where the waste heat is transferred. Fluids suitable for immersion cooling have very good insulating properties to ensure that they can safely come into contact with energized electronic components without significantly altering the electrical characteristics of the system or system components. Immersion cooling has the potential to become a popular cooling solution for datacenters because it allows operators to drastically reduce their energy usage through the elimination of the air cooling infrastructure.

Broadly speaking, there are two different types of immersion cooling techniques: single-phase immersion cooling and two-phase immersion cooling.

With a single-phase immersion cooling system, the working fluid never changes state and always remains in a liquid form. In some implementations, the working fluid may be actively circulated by pumping the dielectric coolant in, through, and around the computing devices being cooled, and then transferring the heat absorbed by the coolant to a heat rejection device such as a radiator, dry cooler, liquid-to-liquid heat exchanger, or cooling tower. Alternatively, the working fluid may be passively circulated by the natural convection of the heated coolant to the heat rejection device(s).

In a two-phase immersion cooling system, the heat of vaporization and the specific heat capacity characteristics of the dielectric working fluid are utilized for cooling. The dielectric working fluid generally has a relatively low boiling point such that heat absorbed by the dielectric working fluid surrounding the computing devices causes a portion of the dielectric working fluid to boil off or vaporize into a gas. The phase change of the dielectric working fluid carries heat away from the computing devices. The vapors produced by the boiling of the dielectric working fluid rise above the fluid pool where they contact a condenser that is cooler than the dielectric working fluid's boiling point. This causes the vapors to condense back into a liquid and fall back into the fluid pool.

SUMMARY

In accordance with one aspect of the present disclosure, an immersion cooling system includes an immersion tank that is configured to retain dielectric working fluid and to hold a plurality of computing devices submerged in the dielectric working fluid. The immersion cooling system also includes a condenser that is configured to cause condensation of vaporized working fluid. The immersion cooling system also includes a subcooling heat exchanger that is in fluid communication with a coolant source. The coolant source provides coolant having a coolant temperature that is lower than a boiling point of the dielectric working fluid. The subcooling heat exchanger is positioned so that heat transfer can occur between the dielectric working fluid and the subcooling heat exchanger. The immersion cooling system also includes a control system that controls how much of the coolant flows into the subcooling heat exchanger based at least in part on a temperature of the dielectric working fluid.

In some embodiments, the condenser can be located in a vapor space of the immersion tank, and the subcooling heat exchanger can be submerged in the dielectric working fluid.

In some embodiments, both the condenser and the subcooling heat exchanger can be embedded in an external wall of the immersion tank.

In some embodiments, the control system can include a temperature sensor that measures the temperature of the dielectric working fluid, a valve that controls a flow of the coolant to the subcooling heat exchanger, and a controller that controls opening and closing of the valve based at least in part on the temperature of the dielectric working fluid.

In some embodiments, the controller can calculate an error value as a difference between a desired temperature of the dielectric working fluid and the temperature of the dielectric working fluid as measured by the temperature sensor. The opening and the closing of the valve can be based at least in part on the error value.

In some embodiments, the immersion cooling system additionally includes a pipe that is submerged in the dielectric working fluid. The pipe can include a plurality of nozzles and a pump that forces the dielectric working fluid to flow through the pipe. The pipe can be positioned to cause a plurality of streams of the dielectric working fluid to exit out of the plurality of nozzles in a direction of at least one heat-generating component on at least one computing device.

In some embodiments, the control system can be additionally configured to proactively adjust coolant flow to the subcooling heat exchanger based at least in part on an expected workload of the plurality of computing devices.

In some embodiments, the immersion tank can additionally include a diaphragm that can affect a vapor space pressure in the vapor space of the immersion tank. Increasing the vapor space pressure can cause a saturation temperature of the dielectric working fluid to increase. Decreasing the vapor space pressure can cause the saturation temperature of the dielectric working fluid to decrease.

In some embodiments, the diaphragm can be located in the vapor space of the immersion tank. The condenser and the subcooling heat exchanger can be embedded in an external wall of the immersion tank.

In some embodiments, the immersion cooling system additionally include a relief valve connected to the diaphragm. The relief valve can be configured to release pressure from the diaphragm when the vapor space pressure equals the diaphragm pressure.

In accordance with another aspect of the present disclosure, an immersion cooling system includes an immersion tank that is configured to retain dielectric working fluid and to hold a plurality of computing devices submerged in the dielectric working fluid. The immersion tank includes a vapor space above the dielectric working fluid. The immersion cooling system also includes a condenser that is configured to cause condensation of vaporized working fluid. The immersion cooling system also includes a subcooling heat exchanger that is in fluid communication with a coolant source. The coolant source provides coolant having a coolant temperature that is lower than a boiling point of the dielectric working fluid. The subcooling heat exchanger is positioned so that heat transfer can occur between the dielectric working fluid and the subcooling heat exchanger. The immersion cooling system also includes a diaphragm that changes a vapor space pressure in the vapor space of the immersion tank. Changing the vapor space pressure also changes a saturation temperature of the dielectric working fluid.

In some embodiments, the diaphragm can be located in the vapor space of the immersion tank, and the condenser and the subcooling heat exchanger can be embedded in an external wall of the immersion tank.

In some embodiments, the immersion cooling system additionally include a relief valve connected to the diaphragm. The relief valve can be configured to release pressure from the diaphragm when the vapor space pressure equals the diaphragm pressure.

In some embodiments, the condenser can be located in the vapor space of the immersion tank, and the subcooling heat exchanger can be submerged in the dielectric working fluid.

In some embodiments, the immersion cooling system can additionally include a control system that controls how much of the coolant flows into the subcooling heat exchanger based at least in part on a temperature of the dielectric working fluid.

In some embodiments, the control system can include a temperature sensor that measures the temperature of the dielectric working fluid, a valve that controls a flow of the coolant to the subcooling heat exchanger, and a controller that controls opening and closing of the valve based at least in part on the temperature of the dielectric working fluid.

In some embodiments, the controller can calculate an error value as a difference between a desired temperature of the dielectric working fluid and the temperature of the dielectric working fluid as measured by the temperature sensor. The opening and the closing of the valve can be based at least in part on the error value.

In some embodiments, the immersion cooling system can additionally include a pipe that is submerged in the dielectric working fluid. The pipe can include a plurality of nozzles and a pump that forces the dielectric working fluid to flow through the pipe. The pipe can be positioned to cause a plurality of streams of the dielectric working fluid to exit out of the plurality of nozzles in a direction of at least one heat-generating component on at least one computing device.

Another aspect of the present disclosure is directed to a method for subcooling dielectric working fluid in an immersion cooling system that includes a plurality of computing devices submerged in the dielectric working fluid. The method can include determining a desired temperature of the dielectric working fluid. The desired temperature of the dielectric working fluid can be less than a boiling point of the dielectric working fluid. The method can also include calculating an error value as a difference between the desired temperature of the dielectric working fluid and a measured temperature of the dielectric working fluid. The method can also include causing coolant to flow to a subcooling heat exchanger based at least in part on the error value when the measured temperature of the dielectric working fluid is greater than the desired temperature of the dielectric working fluid. The method can also include preventing the coolant from flowing to the subcooling heat exchanger when the measured temperature of the dielectric working fluid is less than or equal to the desired temperature of the dielectric working fluid.

In some embodiments, the immersion cooling system can additionally include a diaphragm having a diaphragm pressure and a relief valve connected to the diaphragm. The method can additionally include pressurizing the diaphragm to increase pressure in a vapor space of the immersion tank. Increasing the pressure in the vapor space of the immersion tank can cause a saturation temperature of the dielectric working fluid to increase. The method can additionally include causing the relief valve to release pressure from the diaphragm when the pressure in the vapor space of the immersion tank equals the diaphragm pressure.

In some embodiments, the method can include increasing a flow rate of the coolant to the subcooling heat exchanger in response to overclocking at least one component in at least one computing device of the plurality of computing devices.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows. Features and advantages of the disclosure may be realized and obtained by means of the systems and methods that are particularly pointed out in the appended claims. Features of the present disclosure will become more fully apparent from the following description and appended claims, or may be learned by the practice of the disclosed subject matter as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. Understanding that the drawings depict some example embodiments, the embodiments will be described and explained with additional specificity and detail through the use of the accompanying drawings in which.

DETAILED DESCRIPTION

Figure 1:
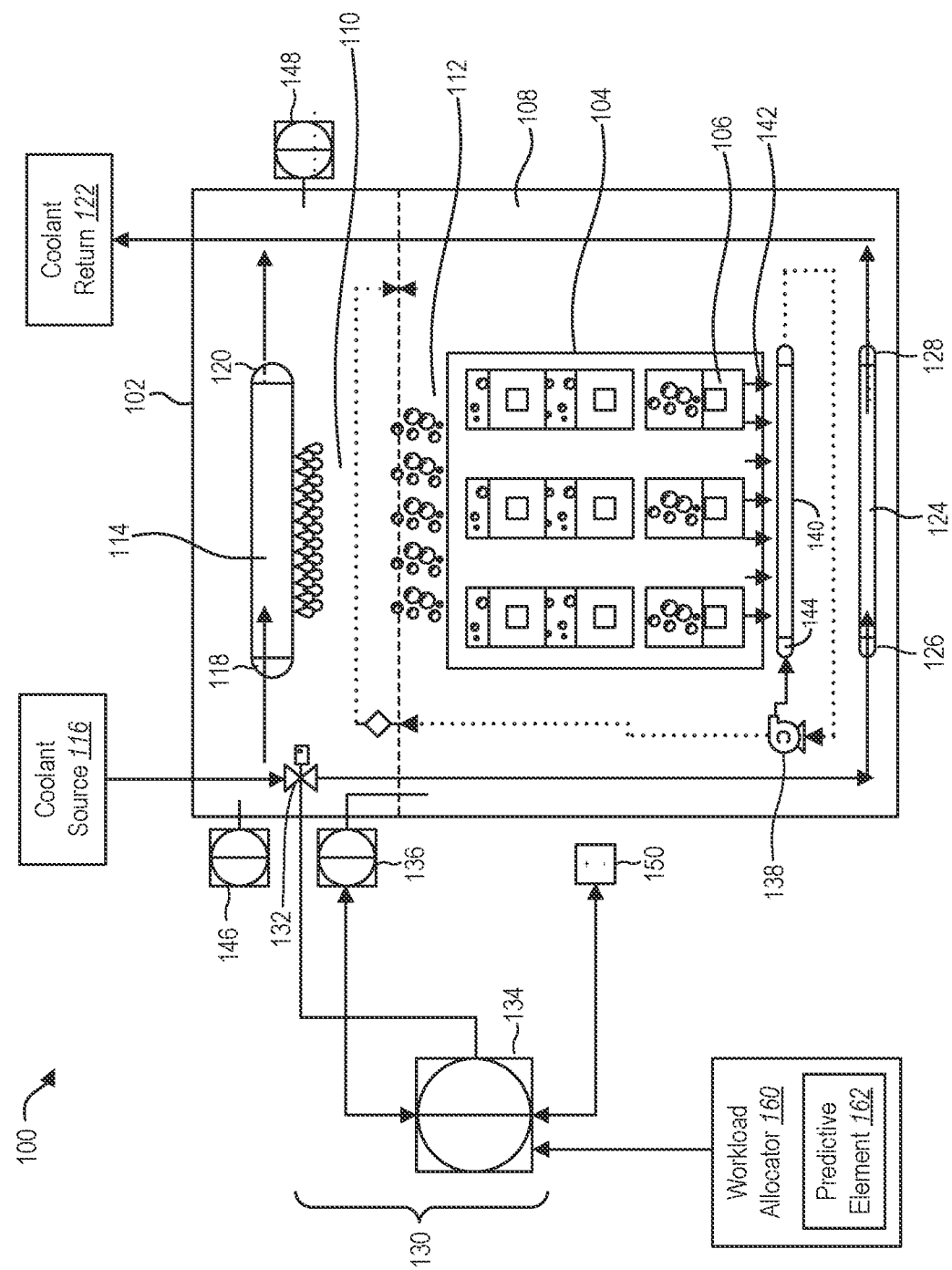
FIG. 1 illustrates an example of an immersion cooling system in accordance with at least one embodiment of the present disclosure.

The present disclosure is generally related to an improved immersion cooling system that can facilitate greater heat transfer away from heat-generating components of computing devices (e.g., integrated circuits such as CPUs) than is possible with currently available immersion cooling systems. More specifically, the techniques disclosed herein can enable greater heat flux at the heat-generating components of computing devices than is possible with currently available immersion cooling systems.

An immersion cooling system in accordance with the present disclosure can utilize subcooling to increase the heat flux at the heat-generating components of computing devices. The term "subcooling" refers to a liquid existing at a temperature below its normal boiling point.

When components of a computing device that is submerged in dielectric working fluid generate heat and cause the dielectric working fluid to boil, this causes vapor bubbles to be generated at or near the surface of the heat-generating components. Subcooling the dielectric working fluid can affect both the size of the vapor bubbles that are generated and the frequency at which they are generated. More specifically, subcooling the dielectric working fluid can increase the frequency of bubble generation. In addition, subcooling the dielectric working fluid can reduce the diameter of the vapor bubbles that are generated. This is at least in part because the subcooled conditions cause bubbles departing from the surface of a heat-generating component to shrink as they come in contact with cooler surrounding liquid. Both of these effects (increasing the frequency at which vapor bubbles are generated, and decreasing the diameter of the vapor bubbles that are generated) can increase the maximum heat load the dielectric working fluid can carry away from a heat-generating component.

Heat transfer through the boiling of a dielectric fluid, in the manner described above, is limited by a condition called the "critical heat flux." In the context of immersion cooling, the critical heat flux can refer to a point where the amount of heat that is generated by a component of a computing device becomes sufficiently large that the departure rate of bubbles (formed from boiling of the dielectric working fluid) becomes insufficient to cool the component. Advantageously, subcooling can extend the critical heat flux of an immersion cooling system. In other words, subcooling can enable more heat to be transferred before the critical heat flux limitation occurs than would be the case in the absence of subcooling.

One or more heat exchangers can be used to facilitate subcooling. As noted above, a two-phase immersion cooling system typically includes one or more heat exchangers in the form of condensers that are positioned to come into contact with vaporized working fluid, thereby causing the vaporized working fluid to condense back into a liquid and fall back into the pool of dielectric working fluid. In accordance with the present disclosure, however, an immersion cooling system can also include one or more additional heat exchangers for the purpose of facilitating subcooling. The heat exchanger(s) that are used to facilitate subcooling can be separate from the condensers that cause the working fluid vapors to condense back into the pool of dielectric fluid. A heat exchanger that facilitates subcooling may be referred to herein as a subcooling heat exchanger.

An immersion cooling system in accordance with the present disclosure can include one or more subcooling heat exchangers that are positioned so that heat transfer can occur between the dielectric working fluid and the subcooling heat exchanger(s). In some embodiments, one or more subcooling heat exchangers can be submerged in the dielectric working fluid. In some embodiments, one or more subcooling heat exchangers can be embedded in an external wall of the immersion tank.

A subcooling heat exchanger can be in fluid communication with a source of coolant. The coolant source can provide coolant having a temperature that is lower than a boiling point of the dielectric working fluid. The immersion cooling system can also include a control system that controls how much of the coolant flows into the subcooling heat exchanger based at least in part on the temperature of the dielectric working fluid. The control system can include a temperature sensor that measures the temperature of the dielectric working fluid, a valve that controls a flow of the coolant to the subcooling heat exchanger, and a controller that controls opening and closing of the valve based at least in part on the temperature of the dielectric working fluid.

In some embodiments, the controller can be configured to calculate an error value as a difference between a desired temperature of the dielectric working fluid and the temperature of the dielectric working fluid as measured by the temperature sensor. The opening and the closing of the valve can be based at least in part on the error value. For example, if the desired temperature of the dielectric working fluid is greater than or equal to the measured temperature, then the controller can cause the valve to be closed in order to prevent coolant from flowing to the subcooling heat exchanger. On the other hand, if the measured temperature of the dielectric working fluid exceeds the desired temperature, then the controller can cause the valve to be opened so that coolant can flow to the subcooling heat exchanger.

In some embodiments, an immersion cooling system in accordance with the present disclosure can also utilize the manipulation of pressure to increase the heat flux at the heat-generating components of computing devices. In other words, an immersion cooling system in accordance with the present disclosure can utilize a combination of subcooling and the manipulation of pressure to achieve the benefits described herein. As with subcooling, the manipulation of pressure can also extend the critical heat flux of an immersion cooling system.

Pressure manipulation can be accomplished through the use of a diaphragm. In some embodiments, the diaphragm can be located in the vapor space of the immersion tank. In this context, the vapor space of the immersion tank can refer to the part of the immersion tank that is directly above the pool of dielectric working fluid. When the dielectric working fluid boils, vapors can rise into the vapor space of the immersion tank.

The diaphragm can be separated from the rest of the immersion tank. Having the diaphragm in the immersion tank can cause the pressure in the rest of the immersion tank to increase. This can cause the saturation temperature of the dielectric working fluid to increase. Advantageously, increasing the saturation temperature of the dielectric working fluid can increase the heat flux at the heat-generating components of the computing devices that are submerged in the dielectric working fluid.

A relief valve can be connected to the diaphragm. The relief valve can be configured to release pressure from the diaphragm when the pressure in the vapor space of the immersion tank equals the pressure in the diaphragm.

As noted above, the techniques disclosed herein can enable greater heat flux at the heat-generating components of computing devices than is possible with currently available immersion cooling systems. One of the benefits of this additional heat flux is that it allows the computing devices to be utilized to a greater extent than would otherwise be possible. For example, the additional heat flux provided by the techniques disclosed herein can enable the use of overclocking.

In general terms, overclocking is the practice of increasing the clock rate of a computer to exceed that certified by the manufacturer. More specifically, overclocking increases the operating speed of a given component. Normally, overclocking is used to increase the performance of a major chip or subsystem, such as the main processor or graphics controller. However, overclocking can also be used in connection with other components, such as system memory and/or system buses.

Overclocking causes an increase in power consumption. When a particular component is overclocked, higher current and voltage are applied to the component so that its power consumption increases. This can create thermal challenges.

Components of a computing device are typically designed for normal operation, without overclocking. When a particular component is overclocked, that component is pushed farther from a power perspective, thereby causing additional heat to be generated. An overclocked component may be unreliable or fail completely if the additional heat load is not removed. The techniques disclosed herein, including subcooling and pressure manipulation, can be used to more effectively remove the additional heat that is produced by overclocking so that overclocking can be safely utilized.

There are many benefits that can be achieved through the use of overclocking. As just one example, consider a scenario where customers rent the use of virtual machines (VMs) that run on servers maintained by a cloud computing provider. By overclocking the processors in the servers, more VMs could be created. Alternatively, the same number of VMs could be created, but the VMs could have improved performance. Alternatively still, some combination of more VMs and improved performance could be achieved. The techniques disclosed herein enable these benefits to be realized by facilitating the use of overclocking in a safe, sustainable way.

FIG. 1 illustrates an example of an immersion cooling system 100 in accordance with at least one embodiment of the present disclosure. The immersion cooling system 100 includes an immersion tank 102. The immersion tank 102 is configured to hold a plurality of computing devices. For simplicity, FIG. 1 shows a single computing device in the immersion tank 102. In particular, FIG. 1 shows a motherboard 104 in the immersion tank 102. A plurality of heat-generating components are located on the motherboard 104. The heat-generating components can include integrated circuits 106 on the motherboard 104.

The immersion tank 102 is also configured to retain dielectric working fluid 108. The computing devices are positioned in the immersion tank 102 such that the computing devices are submerged in the dielectric working fluid 108. FIG. 1 shows the motherboard 104 submerged in the dielectric working fluid 108.

As discussed above, the computing devices in the immersion tank 102 generate heat during normal operation. The dielectric working fluid 108 has a relatively low boiling point such that heat absorbed by the dielectric working fluid 108 surrounding the computing devices causes a portion of the dielectric working fluid 108 to boil off or vaporize into a gas. The vapors produced by the boiling of the dielectric working fluid 108 rise above the fluid pool into a part of the immersion tank 102 that may be referred to herein as a vapor space 110. The vapor space 110 is located above the dielectric working fluid 108. FIG. 1 shows vaporized working fluid 112 rising up above the pool of dielectric working fluid 108. As the vaporized working fluid 112 continues to rise, it will enter the vapor space 110 of the immersion tank 102.

The immersion cooling system 100 includes a condenser 114 located in the vapor space 110 of the immersion tank 102. The condenser 114 is in fluid communication with a coolant source 116. The coolant source 116 can be any system that is capable of supplying coolant to the immersion cooling system 100.

In some embodiments, the coolant can be any fluid that has a higher thermal transfer rate than the dielectric working fluid 108, and is a liquid at and below the boiling point of the dielectric working fluid 108. One example of a coolant that could be used is water. However, this example should not be interpreted as limiting the scope of the present disclosure. There are many other fluids that could be used as the coolant.

When the coolant source 116 supplies the coolant to the immersion cooling system 100, the temperature of the coolant is lower than the boiling point of the dielectric working fluid 108. Therefore, as the coolant flows through the condenser 114, the condenser 114 is cooled. The condenser 114 is positioned so that it will cause condensation of vaporized working fluid 112. In the depicted embodiment, the condenser 114 is positioned directly above the dielectric working fluid 108, so that it will come into direct contact with vaporized working fluid 112. Therefore, when coolant flows through the condenser 114, the condenser 114 will cause the vaporized working fluid 112 to condense back into a liquid and fall back into the pool of dielectric working fluid 108.

A pump (not shown) causes the coolant to flow through the condenser 114. For purposes of the present discussion, it will be assumed that the coolant flows from left to right in FIG. 1. Coolant enters an inlet 118 of the condenser 114. As vaporized working fluid 112 comes into contact with the condenser 114, the coolant is heated. Heated coolant exits out of an outlet 120 of the condenser 114. FIG. 1 shows the heated coolant being returned to a coolant return 122. The coolant return 122 can be any device or system that is capable of receiving heated coolant from the immersion cooling system 100.

The arrows from the coolant source 116 to the inlet 118 of the condenser 114 represent one or more pipes that deliver the coolant from the coolant source 116 to the inlet 118 of the condenser 114. Similarly, the arrows from the outlet 120 of the condenser 114 to the coolant return 122 represent one or more pipes that deliver the heated coolant from the outlet 120 of the condenser 114 to the coolant return 122.

In addition to the condenser 114, the immersion cooling system 100 also includes another heat exchanger. This other heat exchanger may be referred to herein as a subcooling heat exchanger 124. Whereas the condenser 114 causes condensation of vaporized working fluid 112, the subcooling heat exchanger 124 is positioned so that it will facilitate subcooling of the dielectric working fluid 108. In other words, the subcooling heat exchanger 124 is positioned so that it will cause heat transfer to occur between the dielectric working fluid 108 and the subcooling heat exchanger 124. In the depicted embodiment, the subcooling heat exchanger 124 is submerged in the dielectric working fluid 108, so that the subcooling heat exchanger 124 will come into direct contact with the dielectric working fluid 108.

Like the condenser 114, the subcooling heat exchanger 124 is also in fluid communication with the coolant source 116. A pump (not shown) causes the coolant to enter an inlet 126 of the subcooling heat exchanger 124 and flow through the subcooling heat exchanger 124. As the coolant flows through the subcooling heat exchanger 124, the subcooling heat exchanger 124 will subcool the dielectric working fluid 108. As discussed above, subcooling the dielectric working fluid 108 can increase the frequency of bubble generation while also reducing the diameter of the vapor bubbles that are generated. Both of these effects can increase the maximum heat load the dielectric working fluid 108 can carry away from the heat-generating components (e.g., the integrated circuits 106) on the motherboard 104. As the coolant flows through the subcooling heat exchanger 124 and it subcools the dielectric working fluid 108, the coolant is heated. Heated coolant exits out of an outlet 128 of the subcooling heat exchanger 124. FIG. 1 shows the heated coolant being returned to the coolant return 122.

In the depicted embodiment, the same coolant source 116 is shown providing coolant to the condenser 114 and also to the subcooling heat exchanger 124. In alternative embodiments, however, different coolant sources could be used. For example, a first coolant source could provide coolant to the condenser 114, and a second coolant source that is different from the first coolant source could provide coolant to the subcooling heat exchanger 124.

Similarly, in the depicted embodiment, the same coolant return 122 is shown receiving coolant from the condenser 114 and from the subcooling heat exchanger 124. In alternative embodiments, however, different coolant returns could be used. For example, a first coolant return could receive coolant from the condenser 114, and a second coolant return that is different from the first coolant return could receive coolant from the subcooling heat exchanger 124.

The immersion cooling system 100 includes a control system 130 that controls the extent to which the dielectric working fluid 108 is subcooled. More specifically, the control system 130 is configured to control how much of the coolant flows into the subcooling heat exchanger 124 based at least in part on the temperature of the dielectric working fluid 108. The control system 130 includes a valve 132, a controller 134, and a temperature sensor 136. The valve 132 controls the flow of coolant to the subcooling heat exchanger 124. The controller 134 controls the opening and the closing of the valve 132 based at least in part on the temperature of the dielectric working fluid 108. In FIG. 1, the controller 134 is shown connected to a power supply 150. The temperature sensor 136 measures the temperature of the dielectric working fluid 108.

When the valve 132 is open, coolant can flow to the subcooling heat exchanger 124. Conversely, when the valve 132 is closed, coolant is prevented from flowing to the subcooling heat exchanger 124. In some embodiments, the valve 132 can be capable of one or more intermediate states between fully opened and fully closed. For example, the valve 132 can be capable of being partially opened. When the valve 132 is partially opened, the rate of coolant flow can be greater than zero but less than when the valve 132 is fully opened.

In some embodiments, the controller 134 can be configured to continuously calculate an error value. The error value can be calculated as the difference between (a) the desired temperature of the dielectric working fluid 108, and (b) the actual temperature of the dielectric working fluid 108 (e.g., as measured by the temperature sensor 136). To facilitate subcooling, the desired temperature of the dielectric working fluid 108 can be set to be below the boiling point of the dielectric working fluid 108.

The controller 134 can then open or close the valve 132 depending on the error value that is calculated. For example, if (a) is greater than or equal to (b), then the controller 134 can close the valve 132. On the other hand, if (b) exceeds (a), then the controller 134 can open the valve 132 and allow coolant to flow to the subcooling heat exchanger 124. In some embodiments, the extent to which the valve 132 is opened can depend at least in part on the extent to which (b) exceeds (a). For example, if (b) greatly exceeds (a), then the valve 132 can be opened to a greater extent than if (b) only slightly exceeds (a).

In some embodiments, the controller 134 can be implemented as a proportional-integral-derivative (PID) controller. A PID controller continuously calculates an error value (such as the error value described above) and applies a correction based on proportional, integral, and derivative terms.

In the depicted embodiment, the valve 132 controls the supply of coolant to the subcooling heat exchanger 124, but does not control the supply of coolant to the condenser 114. In some alternative embodiments, a valve could be provided that controls the supply of coolant to both the subcooling heat exchanger 124 and also to the condenser 114. In some other alternative embodiments, at least two different valves could be provided. A first valve could control the supply of coolant to the subcooling heat exchanger 124, and a second valve that is different from the first valve could control the supply of coolant to the condenser 114.

In some embodiments, the control system 130 can be configured to use information about the expected or incoming workload of the computing devices in the immersion tank 102 for the purpose of controlling the flow of coolant to the subcooling heat exchanger 124. In other words, information about the expected or incoming workload can be used proactively to control the flow of coolant to the subcooling heat exchanger 124.

As noted above, the immersion cooling system 100 can be used in a datacenter. The datacenter can include a plurality of immersion tanks like the immersion tank 102 shown in FIG. 1. A workload allocator 160 can be responsible for allocating workloads among the computing devices in the various immersion tanks. For example, the workload allocator 160 can be responsible for allocating virtual machines (VMs) among the computing devices in the various immersion tanks. The control system 130 can be in electronic communication with the workload allocator 160. The workload allocator 160 can include a predictive element 162 that provides for proactive subcooling. The workload allocator 160 can provide information and/or signals to the control system 130 that cause the flow of coolant to the subcooling heat exchanger 124 to be adjusted based on the expected or predicted workload to be experienced by the computing devices in the immersion tank 102.

In one possible scenario, the predictive element 162 of the workload allocator 160 could predict that the computing devices in the immersion tank 102 will have increased workload (e.g., that additional VMs will be allocated) at a certain time of day. Based at least in part on this prediction, the workload allocator 160 can provide information and/or signals to the control system 130 that cause the flow of coolant to the subcooling heat exchanger 124 to be increased during this time of day.

The opposite scenario could also occur. The predictive element 162 of the workload allocator 160 could predict that the computing devices in the immersion tank 102 will have decreased workload (e.g., that fewer VMs will be allocated) at a certain time of day. Based at least in part on this prediction, the workload allocator 160 can provide information and/or signals to the control system 130 that cause the flow of coolant to the subcooling heat exchanger 124 to be decreased during this time of day.

Predictions made by the predictive element 162 of the workload allocator 160 can be based at least in part on historical data about the workload experienced by the computing devices in the immersion tank 102 (and in other immersion tanks in the immersion cooling system 100). In some embodiments, machine learning techniques can be utilized to make such predictions.

As discussed above, the additional heat flux provided by the techniques disclosed herein can enable the use of overclocking. In some embodiments, the predictive element 162 of the workload allocator 160 can predict when overclocking will be utilized. When a prediction is made that overclocking will be utilized during a particular period of time, the workload allocator 160 can provide information and/or signals to the control system 130 that cause the flow of coolant to the subcooling heat exchanger 124 to be increased to compensate for the additional power consumption caused by overclocking.

The immersion cooling system 100 shown in FIG. 1 includes just one subcooling heat exchanger 124 submerged in the dielectric working fluid 108. In some alternative embodiments, an immersion cooling system 100 could include a plurality of subcooling heat exchangers submerged in dielectric working fluid 108. In some embodiments, the plurality of subcooling heat exchangers could be in fluid communication with the same coolant source and the same coolant return. In other embodiments, the plurality of subcooling heat exchangers could be in fluid communication with different coolant sources and/or with different coolant returns.

The immersion cooling system 100 also includes a pump 138 that circulates the dielectric working fluid 108 throughout the immersion tank 102. Circulating the dielectric working fluid 108 throughout the immersion tank 102 helps to ensure that the temperature of the dielectric working fluid 108 is substantially uniform.

In addition to circulating the dielectric working fluid 108 throughout the immersion tank 102, the pump 138 also causes the dielectric working fluid 108 to flow through a pipe 140 that is positioned near the computing devices that are being cooled. In FIG. 1, where only a single computing device (i.e., the motherboard 104) is shown, the pipe 140 is positioned close to that computing device. The pipe 140 includes a plurality of nozzles 142. When the pump 138 causes the dielectric working fluid 108 to flow through the pipe 140, this causes streams of dielectric working fluid 108 to exit out of the nozzles 142 in the direction of the heat-generating components (e.g., the integrated circuits 106) on the motherboard 104. In addition to helping to ensure that the temperature of the dielectric working fluid 108 is substantially uniform, aiming streams of dielectric working fluid 108 at the heat-generating components on the motherboard 104 also helps to cool the heat-generating components.

The embodiment shown in FIG. 1 includes just a single pump 138 and a single pipe 140 with nozzles 142. However, an immersion cooling system 100 in accordance with the present disclosure could include a plurality of pumps and/or a plurality of pipes with nozzles. The pumps and/or the pipes with nozzles could be placed in a variety of different locations throughout the immersion tank 102.

In FIG. 1, the pipe 140 with the nozzles 142 is located beneath the bottom side of the motherboard 104. In an alternative embodiment, a pipe with nozzles could be located near the left side, the right side, and/or the top side of the motherboard 104. If the immersion tank 102 includes a plurality of computing devices, pipes with nozzles can be located in similar positions with respect to the plurality of computing devices.

In FIG. 1, the pump 138 is located near an inlet 144 to the pipe 140 with the nozzles 142. In embodiments that include a plurality of pipes similar to the pipe 140 shown in FIG. 1, a plurality of pumps could be provided. The pumps could be positioned such that at least one pump is located near at least one inlet to each pipe in the immersion tank 102.

The immersion cooling system 100 includes a temperature sensor 146 that is configured to measure the temperature of the vapor space 110 of the immersion tank 102. The immersion cooling system 100 also includes a pressure sensor 148 that is configured to measure the pressure of the vapor space 110 of the immersion tank 102. The temperature sensor 146 and the pressure sensor 148 can be used to control the rate of coolant flow through the condenser 114. More specifically, based on the temperature that is measured, the temperature sensor 146 can send a signal to a controller (not shown) that controls the rate of coolant flow through the condenser. Similarly, based on the pressure that is measured, the pressure sensor 148 can also send a signal to the controller. The controller can control the rate of coolant flow through the condenser 114 based at least in part on the signals received from the temperature sensor 146 and the pressure sensor 148.

Figure 2:
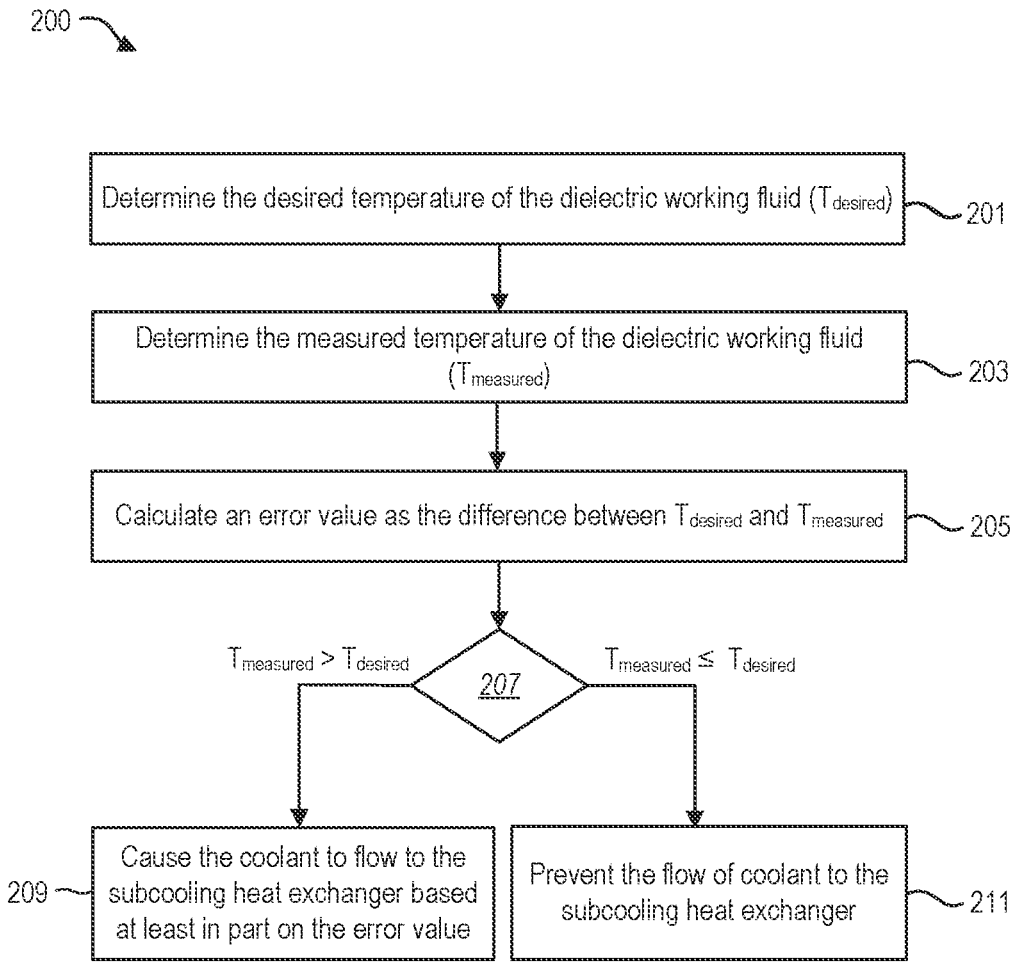
FIG. 2 illustrates an example of a method for subcooling dielectric working fluid in an immersion cooling system in accordance with at least one embodiment of the present disclosure.

FIG. 2 illustrates an example of a method 200 for subcooling dielectric working fluid in an immersion cooling system in accordance with at least one embodiment of the present disclosure. For the sake of clarity, the method 200 will be described in relation to the immersion cooling system 100 shown in FIG. 1. The method 200 can be implemented by a control system, such as the control system 130 in the immersion cooling system 100 of FIG. 1.

The method 200 can include determining 201 the desired temperature of the dielectric working fluid 108 ($T_{desired}$). In some embodiments, $T_{desired}$ can be set to be a pre-determined amount below the saturation temperature ($T_{sat}$) of the dielectric working fluid 108. For example, $T_{desired}$ can be set to be N degrees below $T_{sat}$, where N can be a configurable parameter. In some embodiments, N can be at least 10° C. In other words, in some embodiments $T_{desired}$ can be set to be at least 10° C. below $T_{sat}$.

The value of $T_{sat}$ varies based on the type of dielectric working fluid 108 that is being used. As an example, a typical range for $T_{sat}$ is from about 34° C. to about 60° C.

The method 200 can also include determining 203 the measured temperature of the dielectric working fluid 108 ($T_{measured}$). In some embodiments, determining $T_{measured}$ can include receiving one or more temperature measurements from one or more temperature sensors, such as the temperature sensor 136 shown in FIG. 1.

The method 200 can also include calculating 205 an error value as the difference between $T_{desired}$ and $T_{measured}$. One skilled in the art will understand that calculating the difference between $T_{desired}$ and $T_{measured}$ can be achieved by performing the calculation $T_{desired}-T_{measured}$ or by performing the calculation $T_{measured}-T_{desired}$.

The method 200 can also include determining 207 how to adjust the flow of coolant to the subcooling heat exchanger 124 based at least in part on the error value that is calculated. For example, when $T_{measured}$ is greater than $T_{desired}$, the method 200 can include causing 209 the coolant to flow to the subcooling heat exchanger 124 based at least in part on the error value that is calculated. On the other hand, when $T_{desired}$ is greater than or equal to $T_{measured}$, the method 200 can include preventing 211 the flow of coolant to the subcooling heat exchanger 124.

When $T_{measured}$ is greater than $T_{desired}$ and the method 200 includes causing 209 the coolant to flow to the subcooling heat exchanger 124 based at least in part on the error value that is calculated, there are several different ways that the rate of coolant flow can be determined. In some embodiments, the flow of coolant to the subcooling heat exchanger 124 can depend at least in part on the magnitude of the difference between $T_{measured}$ and $T_{desired}$. For example, the controller 134 can cause more coolant to flow to the subcooling heat exchanger 124 (or, in other words, cause coolant to flow to the subcooling heat exchanger 124 at a faster rate) when $T_{measured}$ is significantly greater than $T_{desired}$ as compared to when $T_{measured}$ is only slightly greater than $T_{desired}$.

In some embodiments, the flow of coolant to the subcooling heat exchanger 124 can be directly proportional to the difference between $T_{measured}$ and $T_{desired}$. For example, consider a scenario in which $T_{measured}-T_{desired}=2n$ at time $t_1$, and $T_{measured}-T_{desired}=n$ at time $t_2$. In this scenario, the rate of coolant flow to the subcooling heat exchanger 124 could be twice as great at time $t_1$ as it is at time $t_2$.

In some embodiments, causing 209 the coolant to flow to the subcooling heat exchanger 124 can include causing a valve 132 that controls the flow of the coolant to the subcooling heat exchanger 124 to be opened. The extent to which the valve 132 is opened can depend on the desired rate of coolant flow. For example, the valve 132 can be opened to a greater extent when a higher rate of coolant flow is desired as compared to when a lesser rate of coolant flow is desired.

As discussed above, the additional heat flux provided by the techniques disclosed herein can enable the use of overclocking. When one or more computing devices in an immersion tank are overclocked, this can cause an increase in power consumption. The increase in power consumption can cause the temperature of the dielectric working fluid to increase. For example, reference is once again made to the immersion cooling system 100 shown in FIG. 1 and the method 200 shown in FIG. 2. If one or more components (e.g., a CPU) on the motherboard 104 is overclocked, the resulting increase in power consumption can cause the temperature of the dielectric working fluid 108 in the immersion tank 102 to increase. The increase in power consumption can cause the error value (i.e., the difference between $T_{desired}$ and $T_{measured}$ that is calculated 205 in the method 200 shown in FIG. 2) to increase. The increase in the error value can therefore cause 209 the coolant to flow to the subcooling heat exchanger 124 at a higher rate.

Figure 3:
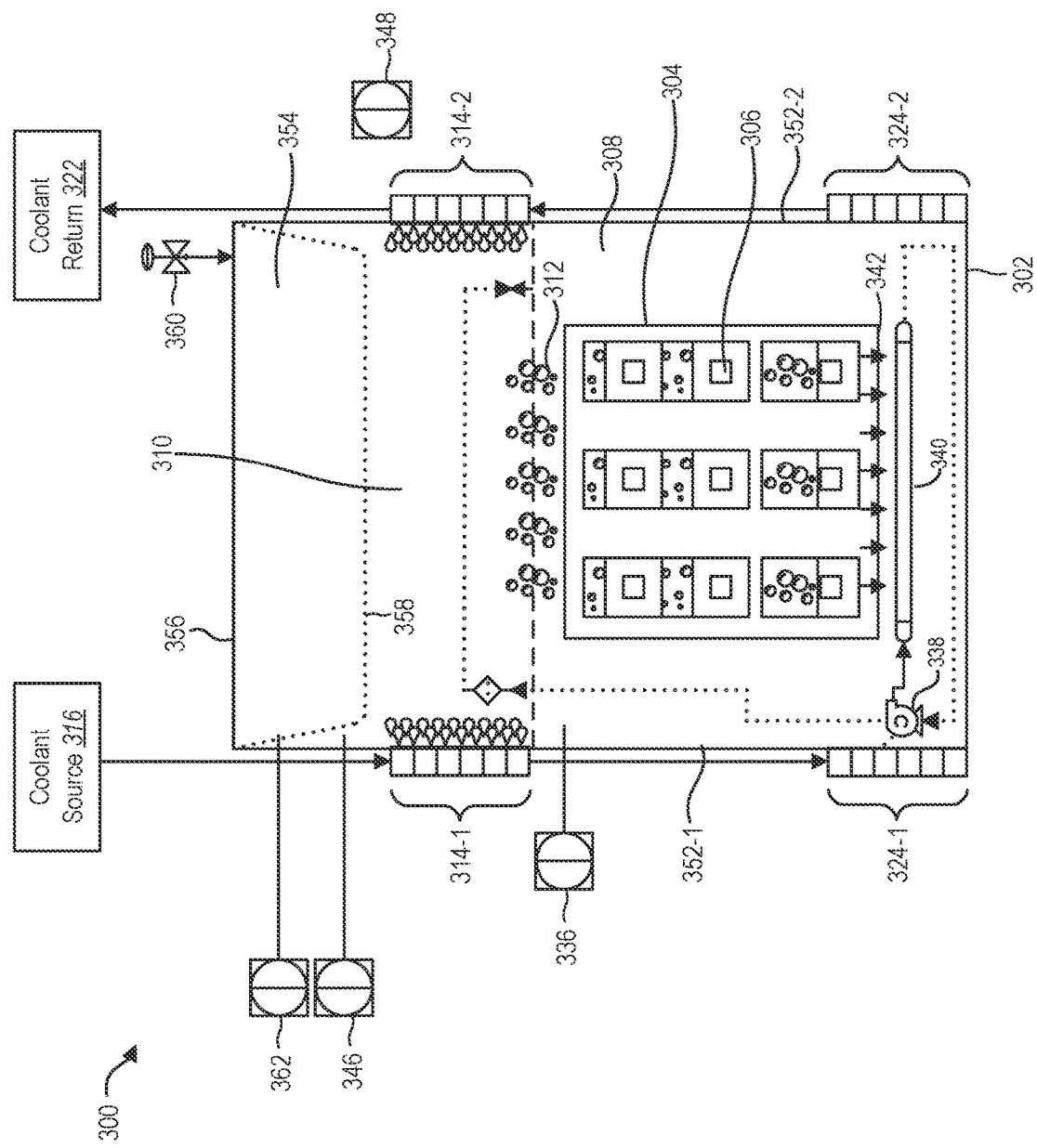
FIG. 3 illustrates another example of an immersion cooling system in accordance with at least one embodiment of the present disclosure.

FIG. 3 illustrates another example of an immersion cooling system 300 in accordance with at least one embodiment of the present disclosure. The immersion cooling system 300 is similar in several respects to the immersion cooling system 100 shown in FIG. 1. For example, the immersion cooling system 300 includes an immersion tank 302 that is configured to hold a plurality of computing devices. For the sake of simplicity, FIG. 3 shows a single computing device in the immersion tank 302, namely a motherboard 304. A plurality of heat-generating components (e.g., integrated circuits 306) are located on the motherboard 304. The immersion tank 302 is also configured to retain dielectric working fluid 308 such that the computing devices in the immersion tank 302 are submerged in the dielectric working fluid 308. FIG. 3 shows the motherboard 304 submerged in the dielectric working fluid 308.

The immersion cooling system 300 also includes a pump 338. In addition to circulating the dielectric working fluid 308 throughout the immersion tank 302, the pump 338 also causes the dielectric working fluid 308 to flow through a pipe 340 that is positioned near the computing devices that are being cooled. The pipe 340 includes a plurality of nozzles 342. When the pump 338 causes the dielectric working fluid 308 to flow through the pipe 340, this causes streams of dielectric working fluid 308 to exit out of the nozzles 342 in the direction of the heat-generating components (e.g., the integrated circuits 306) on the motherboard 304.

The immersion cooling system 300 is shown with a temperature sensor 336 that is configured to measure the temperature of the dielectric working fluid 308. The immersion cooling system 300 is also shown with a temperature sensor 346 that is configured to measure the temperature of the vapor space 310 of the immersion tank 302.

The immersion cooling system 300 is also different in many respects from the immersion cooling system 100 shown in FIG. 1. For example, as discussed above, the immersion cooling system 100 of FIG. 1 includes a condenser 114 in the vapor space 110 of the immersion tank 102 and a subcooling heat exchanger 124 submerged in the dielectric working fluid 108. In contrast, the immersion cooling system 300 shown in FIG. 3 does not include any heat exchangers within the internal part of the immersion tank 302. Instead, the immersion cooling system 300 includes a plurality of condensers and a plurality of subcooling heat exchangers embedded in the external walls of the immersion tank 302.

More specifically, a first external wall 352-1 of the immersion tank 302 includes a plurality of channels that carry coolant from a coolant source 316. A first plurality of upper channels 314-1 are positioned in an upper half of the immersion tank 302, near the vapor space 310 of the immersion tank 302. Because the first plurality of upper channels 314-1 are positioned near the vapor space 310 of the immersion tank 302, the first plurality of upper channels 314-1 act as condensers. Thus, the first plurality of upper channels 314-1 cause condensation of vaporized working fluid 312. A first plurality of lower channels 324-1 are positioned in a lower half of the immersion tank 302, near the computing devices submerged in the dielectric working fluid 308. Because the first plurality of lower channels 324-1 are positioned near the computing devices submerged in the dielectric working fluid 308, the first plurality of lower channels 324-1 act as subcooling heat exchangers. Thus, the first plurality of lower channels 324-1 facilitate subcooling of the dielectric working fluid 308.

Similarly, a second external wall 352-2 of the immersion tank 302 includes a plurality of channels that carry heated coolant to a coolant return 322. A second plurality of upper channels 314-2 are positioned in an upper half of the immersion tank 302, near the vapor space 310 of the immersion tank 302. A second plurality of lower channels 324-2 are positioned in a lower half of the immersion tank 302, near the computing devices submerged in the dielectric working fluid 308.

Having the condensers (i.e., the first plurality of upper channels 314-1 and the second plurality of upper channels 314-2) and the subcooling heat exchangers (i.e., the first plurality of lower channels 324-1 and the second plurality of lower channels 324-2) outside of the immersion tank 302 creates additional space inside the immersion tank 302. This additional space can be utilized for pressure manipulation techniques that facilitate greater heat transfer away from heat-generating components of computing devices.

In the depicted embodiment, a diaphragm 354 can be included in the vapor space 310 of the immersion tank 302. The diaphragm 354 can be formed in the lid 356 of the immersion tank 302. A partition 358 can extend downward from the lid 356 and separate the diaphragm 354 from the rest of the immersion tank 302.

Because the diaphragm 354 is separated from the rest of the immersion tank 302, the pressure inside the diaphragm 354 can be different from the pressure in the rest of the immersion tank 302. In the discussion that follows, the pressure inside the diaphragm 354 may be referred to as $P_{dia}$.

The pressure in the vapor space 310 of the immersion tank 302 may be referred to as $P_{in/vap}$.

The diaphragm 345 can be used to manipulate $P_{in/vap}$. In some situations, having the diaphragm 354 in the immersion tank 302 can cause $P_{in/vap}$ to increase. In other words, $P_{in/vap}$ can be higher with the diaphragm 354 in the immersion tank 302 than it would otherwise be without the diaphragm 354. Moreover, increasing $P_{in/vap}$ can cause the saturation temperature of the dielectric working fluid 308 ($T_{sat}$) to increase. In this context, $T_{sat}$ is the temperature for a corresponding saturation pressure ($P_{sat}$) at which the dielectric working fluid 308 boils into its vapor phase. Advantageously, increasing $T_{sat}$ of the dielectric working fluid 308 can increase the heat flux at the heat-generating components of the computing devices that are submerged in the dielectric working fluid 308.

In other situations, having the diaphragm 354 in the immersion tank 302 can cause $P_{in/vap}$ to decrease. In other words, $P_{in/vap}$ can be lower with the diaphragm 354 in the immersion tank 302 than it would otherwise be without the diaphragm 354. Moreover, decreasing $P_{in/vap}$ can cause the saturation temperature of the dielectric working fluid 308 ($T_{sat}$) to decrease.

Therefore, the presence of the diaphragm 354 in the immersion tank 302 can cause $P_{in/vap}$ to increase or decrease, which can cause $T_{sat}$ of the dielectric working fluid 308 to increase or decrease. Using the diaphragm 345 to manipulate $P_{in/vap}$ in this way can have the effect of increasing the amount of heat that can be transferred by the immersion cooling system 300.

A relief valve 360 can be connected to the diaphragm 354. The relief valve 360 can be configured to release pressure from the diaphragm 354 when $P_{dia}$ equals $P_{in/vap}$. More specifically, when $P_{in/vap} < P_{dia}$, pressure can continue to accumulate in the vapor space 310 of the immersion tank 302 such that $P_{sat}$ of the dielectric working fluid 308 increases. When $P_{in/vap}$ becomes equal to $P_{dia}$, the relief valve 360 can release pressure from the diaphragm 354.

The immersion cooling system 300 includes a pressure sensor 362 that is configured to measure $P_{dia}$, and a pressure sensor 348 that is configured to measure $P_{in/vap}$.

In the depicted embodiment, the diaphragm 354 is shown in the immersion tank 302. However, in an alternative embodiment, the diaphragm could be located outside of the immersion tank. As long as one side of the diaphragm is connected to the headspace of the immersion tank (either directly or through a connecting orifice), the pressure of the headspace can be regulated without directly injecting additional material into the immersion tank. In some embodiments, a diaphragm that is located outside the immersion tank could be constructed through the use of a hydraulic system that includes an accumulator. In such embodiments, the pressure on the opposing side of the diaphragm could be regulated to change relative pressure and thus influence headspace pressure.

Figure 4:
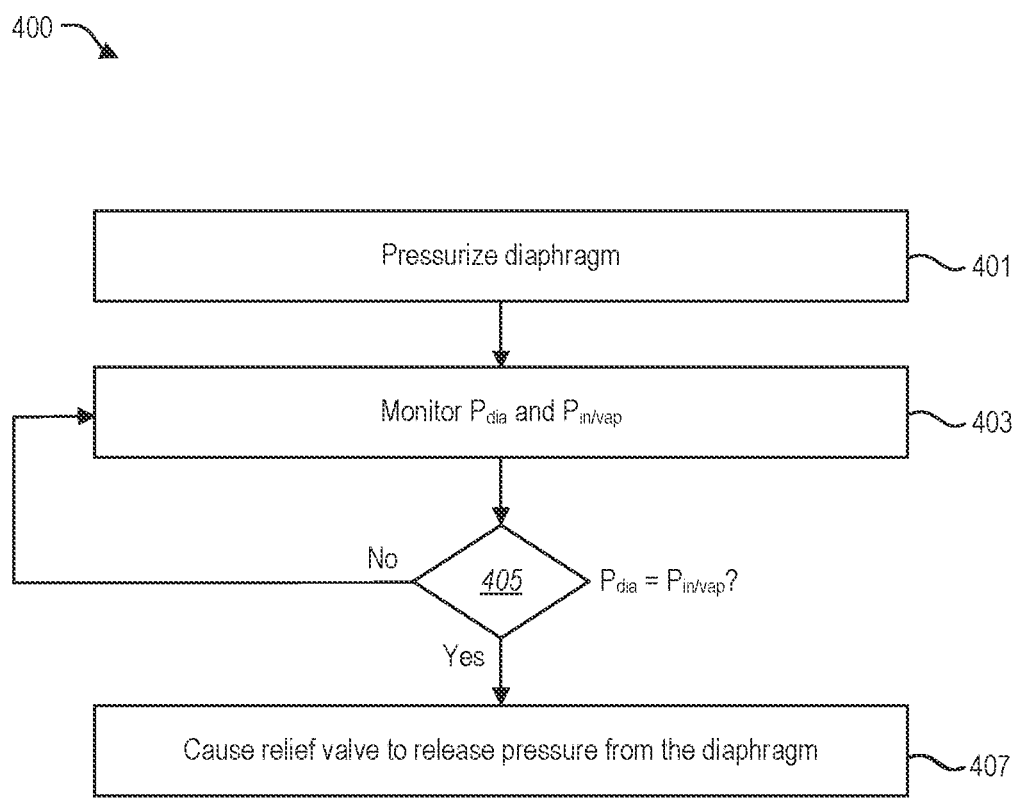
FIG. 4 illustrates an example of a method for using pressure manipulation to increase the heat flux at the heat-generating components of computing devices in an immersion cooling system in accordance with at least one embodiment of the present disclosure.

FIG. 4 illustrates an example of a method 400 for using pressure manipulation to increase the heat flux at the heat-generating components of computing devices in an immersion cooling system in accordance with at least one embodiment of the present disclosure. For the sake of clarity, the method 400 will be described in relation to the immersion cooling system 300 shown in FIG. 3.

The method 400 can include pressurizing 401 the diaphragm 354. The diaphragm 354 can be pressurized 401 to a point where the presence of the diaphragm 354 in the immersion tank 302 causes $P_{in/vap}$ to be higher than it otherwise would be without the diaphragm 354. As discussed above, causing $P_{in/vap}$ to increase can cause $T_{sat}$ of the dielectric working fluid 308 to increase, which can thereby increase the amount of heat that can be transferred by the immersion cooling system 300.

The method 400 can also include monitoring 403 the pressure inside the diaphragm 354 ($P_{dia}$) and the pressure in the vapor space 310 of the immersion tank 302 ($P_{in/vap}$). In some embodiments, monitoring 403 $P_{dia}$ and $P_{in/vap}$ can include receiving one or more pressure measurements from one or more pressure sensors.

The method 400 can also include comparing $P_{dia}$ and $P_{in/vap}$ to determine 405 whether $P_{dia}$ equals $P_{in/vap}$. As long as $P_{in/vap} < P_{dia}$, pressure can continue to accumulate in the vapor space 310 of the immersion tank 302. However, when it is determined 405 that $P_{in/vap}$ is equal to $P_{dia}$, the method 400 can include causing 407 the relief valve 360 to release pressure from the diaphragm 354.

Figure 5A:
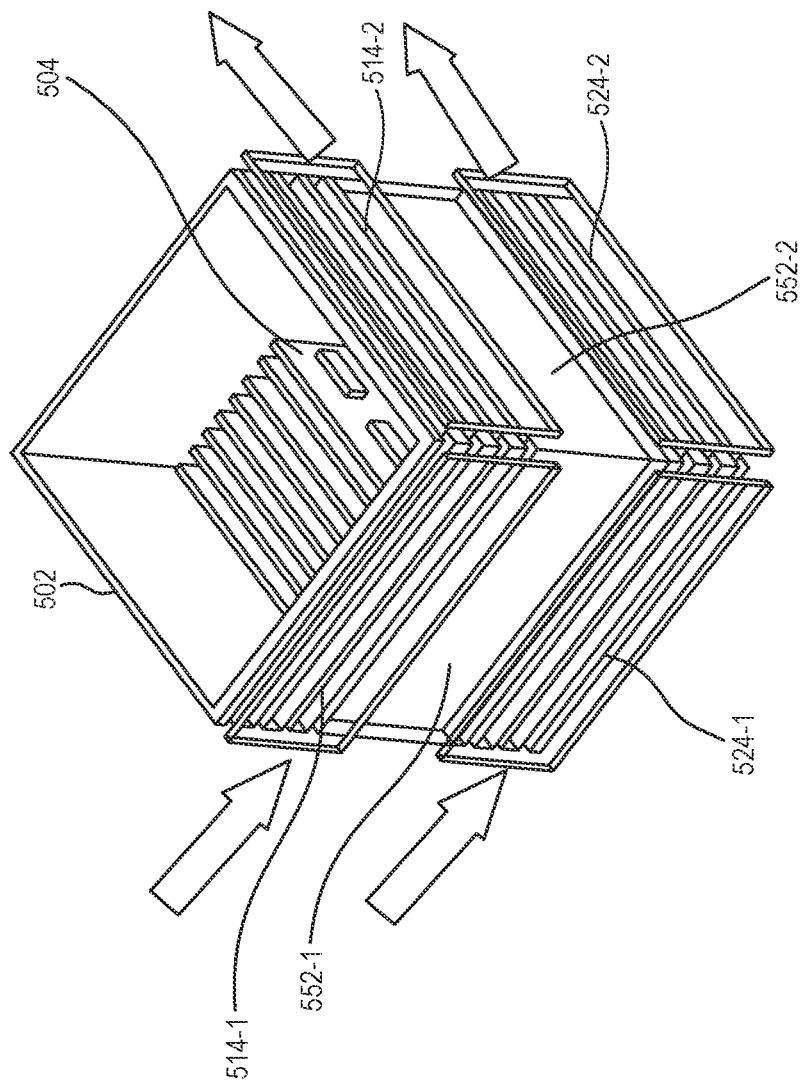
FIG. 5A illustrates a perspective view of another example of an immersion cooling system in accordance with at least one embodiment of the present disclosure.

FIG. 5A illustrates a perspective view of another example of an immersion cooling system 500 in accordance with at least one embodiment of the present disclosure. The immersion cooling system 500 represents one possible implementation of the immersion cooling system 300 shown in FIG. 3.

The immersion cooling system 500 includes an immersion tank 502 that is configured to hold a plurality of computing devices 504. The immersion tank 502 is configured to retain dielectric working fluid (not shown in FIGS. 5A-B) such that the computing devices in the immersion tank 502 are submerged in the dielectric working fluid.

Figure 5B:
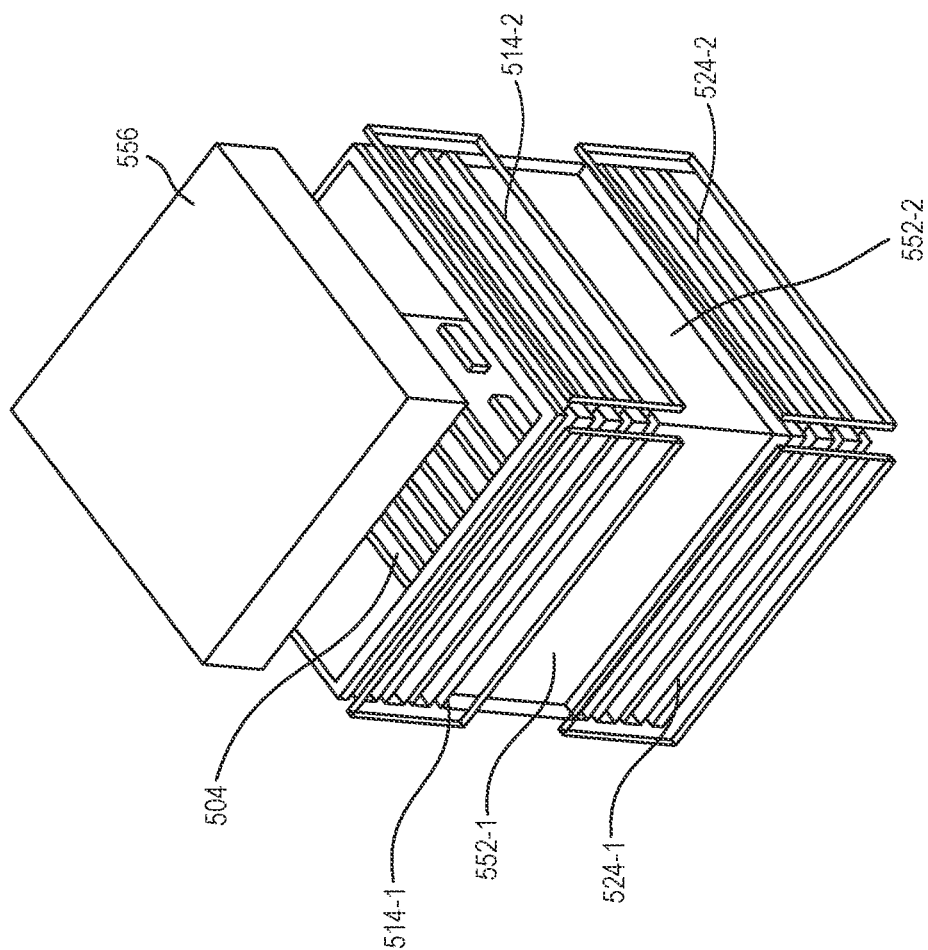
FIG. 5B is a perspective view of the immersion cooling system shown in FIG. 5A with a lid shown on top of the immersion tank.

A first external wall 552-1 of the immersion tank 502 includes a plurality of channels that carry coolant from a coolant source (not shown in FIGS. 5A-B). A first plurality of upper channels 514-1 are positioned in an upper half of the immersion tank 502, near the vapor space of the immersion tank 502. The first plurality of upper channels 514-1 act as condensers that cause condensation of vaporized working fluid. A first plurality of lower channels 524-1 are positioned in a lower half of the immersion tank 502, near the computing devices 504 submerged in the dielectric working fluid. The first plurality of lower channels 524-1 act as subcooling heat exchangers that facilitate subcooling of the dielectric working fluid.

Similarly, a second external wall 552-2 of the immersion tank 502 includes a plurality of channels that carry heated coolant to a coolant return (not shown in FIGS. 5A-B). A second plurality of upper channels 514-2 are positioned in an upper half of the immersion tank 502, near the vapor space of the immersion tank 502. A second plurality of lower channels 524-2 are positioned in a lower half of the immersion tank 502, near the computing devices 504 submerged in the dielectric working fluid.

A pump (not shown) can cause the coolant to flow into the first plurality of upper channels 514-1 and the first plurality of lower channels 524-1. The coolant in the first plurality of upper channels 514-1 causes the vaporized working fluid to condense, and the coolant in the first plurality of lower channels 524-1 subcools the dielectric working fluid. This causes the coolant to become heated. The second plurality of upper channels 514-2 and the second plurality of lower channels 524-2 carries heated coolant to a coolant return.

FIG. 5B is a perspective view of the immersion cooling system 500 shown in FIG. 5A with a lid 556 shown on top of the immersion tank 502. In some embodiments, a diaphragm (not shown in FIGS. 5A-B) can be formed in the lid 556. The diaphragm can be similar to the diaphragm 354 shown in FIG. 3. As discussed above, the diaphragm can be used for pressure manipulation techniques that increase the heat flux at the heat-generating components of the computing devices 504 that are submerged in the dielectric working fluid.

Some examples of various terms and phrases that have been used in the above discussion will now be provided.

The term "heat flux" refers to the rate of thermal energy flow per unit surface area of a heat transfer surface.

The term "immersion tank" may refer to any container that is sufficiently large and sturdy to retain a plurality of computing devices that are submerged in dielectric working fluid.

The term "dielectric working fluid" (or simply "working fluid") may refer to any nonconductive fluid in which computing devices can be submerged for the purpose of cooling the computing devices. Some examples of dielectric working fluids that can be used include synthetic fluids, fluorocarbon-based fluids, mineral oil, and deionized water. A dielectric working fluid may have a relatively low boiling point (e.g., 40-50° C.), such that heat generated by computing devices would normally cause the dielectric working fluid to boil.

The term "condenser" may refer to any apparatus that may be used to condense vaporized working fluid. In some embodiments, a condenser may include one or more tubes, which may be shaped in the form of one or more coils. Cool liquid may be pumped through the tubes to facilitate condensation of vaporized working fluid.

In some embodiments, two structures are in "fluid communication" with one another if there is a path for a fluid to flow between the two structures. In this context, the term "fluid" may refer generally to any substance that has the tendency to assume the shape of its container, and may include a liquid or a gas.

The term "controller" may refer to hardware, software, firmware, or any combination thereof, that performs some or all of the steps, operations, actions, or other functionality disclosed herein in connection with the controller. If implemented in software, the techniques may be realized at least in part by a non-transitory computer-readable medium having computer-executable instructions stored thereon that, when executed by at least one processor, implement the disclosed functionality.

As noted above, the "vapor space" of the immersion tank can refer to the part of the immersion tank that is directly above the pool of dielectric working fluid. In some contexts, the term "headspace" can be synonymous with the term "vapor space." In other contexts, the term "headspace" can refer to a part of the immersion tank that is distinct from the vapor space. For example, the term "headspace" can refer to a part of the immersion tank that is above the vapor space.

The steps, operations, and/or actions of the methods described herein may be interchanged with one another without departing from the scope of the claims. In other words, unless a specific order of steps, operations, and/or actions is required for proper functioning of the method that is being described, the order and/or use of specific steps, operations, and/or actions may be modified without departing from the scope of the claims.

The term "determining" (and grammatical variants thereof) can encompass a wide variety of actions. For example, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The terms "comprising," "including," and "having" are intended to be inclusive and mean that there can be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method for subcooling a dielectric working fluid in an immersion cooling system that comprises a plurality of means for computing, the method comprising:
    determining a desired temperature of the dielectric working fluid, wherein the desired temperature of the dielectric working fluid is less than a boiling point of the dielectric working fluid;
    calculating an error value as a difference between the desired temperature of the dielectric working fluid and a measured temperature of the dielectric working fluid;
    causing coolant to flow to a subcooling heat exchanger based at least in part on the error value when the measured temperature of the dielectric working fluid is greater than the desired temperature of the dielectric working fluid; and
    preventing the coolant from flowing to the subcooling heat exchanger when the measured temperature of the dielectric working fluid is less than or equal to the desired temperature of the dielectric working fluid.

2. The method of claim 1, further comprising increasing a flow rate of the coolant to the subcooling heat exchanger in response to overclocking at least one component of a means for generating heat in at least one means for computing of the plurality of means for computing.

3. The method of claim 1, further comprising adjusting a flow rate of the coolant to the subcooling heat exchanger in response to an expected workload of the plurality of means for computing.

4. The method of claim 1, wherein the subcooling heat exchanger is submerged in the dielectric working fluid.

5. The method of claim 1, wherein the subcooling heat exchanger is embedded in an external wall of an immersion tank of the immersion cooling system.

6. A method of transferring heat from a heat-generating component at least partially submerged in a dielectric working fluid in an immersion cooling system, the method comprising:
    pressurizing a diaphragm, wherein a means for generating heat and the dielectric working fluid are positioned in an immersion tank of the immersion cooling system, and wherein the diaphragm is positioned in a vapor space of the immersion tank;
    increasing a vapor space pressure of the vapor space;
    based on increasing the vapor space pressure, causing an increase in a saturation temperature of the dielectric working fluid; and
    causing an increase in a heat flux from the means for generating heat to the dielectric working fluid based on increasing the saturation temperature.

7. The method of claim 6, wherein increasing the heat flux by pressurizing the diaphragm is in response to overclocking the means for generating heat.

8. The method of claim 7, further comprising monitoring a diaphragm pressure of the diaphragm and monitoring the tank pressure.

9. The method of claim 8, further comprising continuing to pressurize the diaphragm based on determining that the diaphragm pressure is greater than the tank pressure.

10. The method of claim 8, further comprising releasing pressure from the diaphragm based on determining that the tank pressure is equal to the diaphragm pressure.

11. The method of claim 10, wherein releasing pressure from the diaphragm includes opening a pressure relief valve of the diaphragm.

12. The method of claim 6, wherein the immersion cooling system is a two-phase immersion cooling system.

13. An immersion cooling system, comprising:
    an immersion tank that is configured to retain a dielectric working fluid and to hold a plurality of means for computing submerged in the dielectric working fluid;
    a condenser that is configured to cause condensation of vaporized working fluid; and
    a diaphragm that changes a vapor space pressure in a vapor space of the immersion tank, wherein changing the vapor space pressure also changes a saturation temperature of the dielectric working fluid.

14. The immersion cooling system of claim 13, further comprising a subcooling heat exchanger that is in fluid communication with a coolant source, the coolant source providing coolant having a coolant temperature that is lower than a boiling point of the dielectric working fluid, the subcooling heat exchanger being positioned so that heat transfer can occur between the dielectric working fluid and the subcooling heat exchanger.

15. The immersion cooling system of claim 14, further comprising a means for controlling how much of a flow of the coolant flows into the subcooling heat exchanger, wherein the flow of the coolant into the subcooling heat exchanger is based at least in part on a temperature of the dielectric working fluid.

16. The immersion cooling system of claim 14, wherein:
    the condenser is located in a vapor space of the immersion tank; and
    the subcooling heat exchanger is submerged in the dielectric working fluid.

17. The immersion cooling system of claim 14, wherein:
    the diaphragm is located in the vapor space of the immersion tank; and
    the condenser and the subcooling heat exchanger are embedded in an external wall of the immersion tank.

18. The immersion cooling system of claim 13, further comprising a relief valve for releasing a pressure of the diaphragm.

19. The immersion cooling system of claim 18, wherein the relief valve is configured to release the pressure of the diaphragm when the vapor space pressure equals a diaphragm pressure.

20. The immersion cooling system of claim 13, wherein:
    the immersion cooling system further comprises a pipe that is submerged in the dielectric working fluid, the pipe comprising a plurality of nozzles and a pump that forces the dielectric working fluid to flow through the pipe; and the pipe is positioned to cause a plurality of streams of the dielectric working fluid to exit out of the plurality of nozzles in a direction of at least one means for generating heat on at least one means for computing.

* * * * *